United States Patent [19]

Mosser et al.

[11] Patent Number: 4,965,697
[45] Date of Patent: Oct. 23, 1990

[54] SOLID STATE PRESSURE SENSORS

[75] Inventors: Vincent Mosser, Vanves; Jean-Louis Robert, Le Cres, both of France

[73] Assignee: Schlumberger Industries, Montrouge, France

[21] Appl. No.: 330,249

[22] Filed: Mar. 29, 1989

[30] Foreign Application Priority Data

Mar. 30, 1988 [FR] France .................. 88 04175
Mar. 30, 1988 [FR] France .................. 88 04176

[51] Int. Cl.$^5$ ............................................. G01L 9/12
[52] U.S. Cl. .......................................... 361/283
[58] Field of Search .............. 73/718, 724; 361/282, 361/283, 284, 280

[56] References Cited

U.S. PATENT DOCUMENTS 4,196,632  4/1980  Sikorra ..................... 361/283 X

FOREIGN PATENT DOCUMENTS 2714032 10/1978  Fed. Rep. of Germany .
3211968 10/1983  Fed. Rep. of Germany .
3212026 10/1983  Fed. Rep. of Germany .
 633148 12/1949  United Kingdom ............ 73/724

OTHER PUBLICATIONS

H606 U.S. Statutory Invention Registration, 3/1989; Ahn et al., filed 11/27/87.

8030 Electronic Letters—vol. 18 (1982), Sep., No. 18, London, Great Britain.
Phys. (Solid St. Phys 13 (1980), 4323-34 printed in Great Britain. The Conduction Band Structure and Deep Levels in $GA_{1-x}Al_xAs$—Ashok K. Saxena.
Surface Science 142 (1984) 298-305—Hydrostatic Pressure Control of the Carrier Density in GaAs—J. M. Mercy, C. Bousquet, J. L. Robert . . .
Physical Review B—vol. 21, No. 2, Jan. 12, 1980—Pressure and Compositional Dependences of the Hall Coefficient in $Al_xGa_{1-x}As$ and their significance. Physical Review B Volume 30, No. 8, Oct. 15, 1984—Comprehensive Analysis of Si-Doped Theory and Experiments.

Primary Examiner—Donald A. Griffin
Attorney, Agent, or Firm—Sanford J. Asman

[57] ABSTRACT

Solid state pressure sensors based upon aluminum gallium arsenide devices are disclosed. One embodiment uses a TEGFET as a hydrostatic pressure sensor. By adjustment of the gate voltage, it is possible to vary the operating conditions of the sensor, so as to adapt it dynamically to particular measurement conditions. Another hydrostatic pressure transducer, essentially made from aluminum gallium arsenide on a gallium arsenide substrate, comprises a layer sensitive to pressure and a layer sensitive to temperature: due to its homogeneous structure and its rigorous temperature compensation, this transducer offers both high accuracy and high sensitivity.

29 Claims, 5 Drawing Sheets

SOLID STATE PRESSURE SENSORS

The present invention relates to solid state pressure sensors.

In one aspect, the invention is more particularly, but not exclusively, concerned with a device sensitive to a hydrostatic pressure to which it is subjected, comprising at least one layer of aluminum gallium arsenide $Al_xGa_{1-x}As$ of which the relative proportion x of aluminum is less than 0.25, and a second layer of aluminum gallium arsenide $Al_yGa_{1-y}As$ of which the relative proportion y of aluminum is greater than x and lies between 0.15 and 1, and in which is formed, at the interface of these two layers, a conduction channel whose electrical resistance varies as a function of the pressure to which the device is subjected.

The pressure sensitivity of structures made from semi-conductor elements from columns III and V of the Mendeleev table is known today.

In particular, structures of aluminum gallium arsenide on a substrate of gallium arsenide have already been the subject of several publications, and their behavior with pressure or temperature has notably been described in the following articles:

"Pressure and compositional dependences of the Hall coefficient in $Al_yGa_{1-y}As$ and their significance", N.Lifshitz, A. Jayaraman, R. A. Logan, Physical Review B, Vol. 21, No 2, (5 Jan. 1980), pp.670 to 678;

"The conduction band structure and deep levels in $Ga_{1-y}Al_yAs$ alloys from a high pressure experiment", A.Saxena, J. Phys. C: Solid State Phys. 13 (1980), pp.4323 to 4334;

"Comprehensive analysis of Si-doped $Al_yGa_{1-y}As$ (x=0 to 1); Theory and experiments", N.Chand, T. Henderson, J. Klem, W. T. Masselink, R. Fisher, The American Physical Society, Physical Review B, Vol. 30, No 8, (15 Oct. 1984), pp. 4481 to 4492; and "Hydrostatic Pressure Control of the Carrier Density in GaAs/GaAlAs Heterostructures; role of the metastable deep levels", J. M. Mercy, C. Bousquet, J. L. Robert, A. Raymond et al., Surface Science 142, (1984), pp 298–305.

One characteristic of known structures of this family is that a given pressure variation leads to a corresponding relative variation of the resistivity of their sensing layer, which is fixed once and for all by the nature of the material used. At ambient temperature, the limit is 45% per kilobar. As a result, the resolution of such structure, that is to say the smallest value of pressure variation that they are capable of detecting, is indissolubly related to the smallest detectable relative variation of the resistance of their sensing layer.

In another connection, strain gauge pressure sensors using piezoresistivity are known, in which the electrical resistance of each gauge varies as a function of the strain to which it is subjected by the application of the pressure.

It is possible, by judiciously choosing the fabrication parameters of these sensors, to implement structures, in particular structures sensitive to pressure, capable of operating in given ranges of measurement conditions, for example in a predetermined range of temperature and pressure.

However, these structures are most often fragile, limited in their performance, and made complex by the fact that the gauges, which are not directly sensitive to hydrostatic pressure, must be associated with a particular structure of sensor adapted to convert the hydrostatic pressure to be measured into an anisotropic strain to which the gauges are actually responsive.

These artifices lead to the occurrence of numerous problems, notably of long term stability and hysteresis.

In addition, since the adaptation of such a sensor to mean operating conditions is determined once and for all at the moment of its manufacture, a sensor of this type is not capable of being adapted to several different ranges of mean operating conditions.

In this context, one of the objects of the present invention is to provide a pressure sensor capable of dynamic adaptation to different mean measurement conditions and to have, for each of these, a resolution capable of being adjusted and of taking high values.

To this end, the first aspect of the invention provides a device, sensitive to hydrostatic pressure, comprising at least a first layer of aluminum gallium arsenide $Al_xGa_{1-x}As$ of which the relative proportion x of aluminum is less than 0.25, and a second layer of aluminum gallium arsenide $Al_yGa_{1-y}As$ of which the relative proportion y of aluminum is greater than x and lies between 0.15 and 1, and in which is formed, at the interface of these two layers, a conduction channel whose resistance varies as a function of a pressure to which the device is subjected, this latter comprising a two-dimensional electron gas field effect transistor (TEGFET) comprising a drain, a source and a gate.

The layer of aluminum gallium arsenide $Al_yGa_{1-y}As$ is selectively doped with impurities from column IV and/or column VI of the periodic table, for example at least one of the elements Si, Ge, Sn, S, Se and Te, at a total concentration, integrated over the thickness of the layer, which advantageously lies between $10^{12}$ and $10^{13}$ atoms per square centimeter.

Additionally, the first aspect of the invention provides a method of measuring a hydrostatic pressure comprising a first operation consisting of subjecting a pressure sensor to the pressure to be measured, a second operation consisting of obtaining a response signal from the sensor, and a third operation consisting of deducing from this signal the value of the hydrostatic pressure thanks to known relationship between this signal and this value, the method being essentially characterized in that the first and second operations are effected using a sensor which comprises at least one two-dimensional electron gas field effect transistor (TEGFET), comprising a drain, a source and a gate.

A device for implementing the second operation mentioned can comprise means for maintaining the gate, drain and source voltage constant, and means for measuring the current flowing between the drain and the source.

However, this second operation can also be implemented thanks to means for maintaining the drain and source voltages constant and means for adjusting the gate voltage so as to maintain the current flowing between the drain and the source constant.

By these characteristics, the device and the method of the first aspect of the invention are capable of adapting perfectly to the case where the hydrostatic pressure measurement conditions change, in particular by variation of this pressure itself or by variation of the temperature, in the neighborhood of mean measurement conditions, the method comprising then an operation consisting of adjusting, for these mean measurement conditions, the gate voltage to a value just above the threshold voltage of the transistor, and the drain-source voltage to a value greater than the difference between the gate voltage and the threshold voltage, such that the transistor operates in its saturation regime.

As is well known to those skilled in the art, the threshold voltage of the transistor is the gate voltage for which the drain-source current falls to zero. The expression "a value just above the threshold" means here a value exceeding the threshold voltage by at the most 1 volt.

The method of the first aspect of the invention can also be implemented in another form, in which the first operation consists essentially of subjecting to the hydrostatic pressure to be measured a group of two dimensional electron gas field effect transistors integrated in an assembly, known under the name of ring oscillator, made by the connection of an odd number of elementary gates, themselves comprising transistors and Schottky diodes made on the same substrate. The third operation then consists essentially of obtaining the signal produced by this oscillator, and of which the frequency is representative of the pressure to be measured.

A second aspect of the present invention is more particularly, but not exclusively, concerned with a hydrostatic pressure transducer, comprising at least one pressure sensitive semi-conductor layer which is constituted by a compound of at least three elements from columns III and V of the periodic table and whose electrical resistance, varying with said pressure, has a value representative of the latter at constant temperature, this pressure sensitive layer being integral with a substrate constituted by a compound of two of said three elements and obtained by epitaxy.

Semi-conductor based pressure sensors have been in use for about twenty years. Usually they rely upon a structure comprising four silicon gauges disposed in a Wheatstone bridge, deliberately doped with acceptor impurities so that they are of P-type conductivity, said gauges being created by diffusion or implantation of the impurities in a silicon substrate of N-type conductivity.

The effect made use of is piezoresistivity, which manifests itself by the fact that the electrical resistance of each gauge varies as a function of the pressure to which it is subject by application of the pressure.

Since the resistivity of silicon is sensitive only to unidirectional or bidirection strains, and not directly to hydrostatic pressure, sensors of this type are made in such a manner that the application of a hydrostatic pressure translates into the appearance of such strains. To achieve this, the sensors comprise a membrane etched in one of their faces, which is subjected to a reference pressure, while the other face, which bears the strain gauges, is subjected to the hydrostatic pressure to be measured, in such a manner that a system of strains principally directed in the plane of the membrane appears in this other face.

Thanks to a judicious choice of the placing of the gauges with respect to this system of strains, the resistance of two of the gauges of the bridge increases with the applied pressure, while the resistance of the other two decreases. The Wheatstone bridge is then unbalanced, and a signal dependent upon the pressure can thus be obtained.

To implement an absolute pressure transducer with such a sensor, the silicon sensing element must be sealed under zero pressure, for example by a glass of the Pyrex type.

While their properties are satisfactory in numerous applications, these sensors nevertheless have several limitations which impede their use in particular, possibly important, cases.

In particular, not only is the signal provided by sensors of this type intrinsically representative of pressure and temperature simultaneously, but above all a temperature correction of this signal representative of pressure and temperature is always without doubt an extremely delicate matter.

In effect, in the best of cases, such a correction is implemented by virtue of a temperature sensor disposed on the same face as the gauges, but outside the membrane so as not to be subjected to the strains due to the pressure; now, by reason of the heterogeneous structure of the sensor and of the fact that the temperature sensor is not situated in the same environment as the gauges, the time constant to reach thermal equilibrium of the temperature sensor in the case of variation of the temperature, and/or the variation of consecutive mechanical relaxation effects in response to an expansion, of which the time constant is of the order of one minute to one hour, are never the same for the temperature sensor and the gauges, the pressure representative signal cannot be effectively corrected in the case where the pressure and/or the temperature varies rapidly.

In a more general way, these known sensors exhibit all the problems inherent in a composite structure, in particular problems of long term stability and hysteresis.

Semi-conductor materials are known, in another connection, having a good sensitivity to pressure, adapted to provide a response signal to this pressure without recourse to complex structures for converting it into uniaxial or biaxial strains.

Numerous materials of this type have recently been studied, their behavior under pressure being most often observed only with a view to demonstrate other usable properties in other areas of technology, such as microelectronics or optoelectronics.

Among these materials, the semi-conductors indium-antimony, gallium-antimony, aluminum-arsenic, indium-phosphorus, arsenic-gallium, arsenic-indium, and their mixtures figure prominently, doped as type n by an element from columns IV or VI, in particular with silicon, tin, tellurium, sulphur or selenium.

In particular, aluminum gallium arsenide has been the subject of a number of publications, specifically the four publications mentioned hereinbefore.

Although these materials exhibit a fairly high sensitivity to hydrostatic pressure, they also show a temperature sensitivity which, according to the compounds considered and their doping levels, can be very significant.

This problem of temperature dependence of the output signal supposed to represent pressure arises to such an extent, with materials of this type, in a manner a priori much more acute than in the case of piezoresistive silicon gauges, that one skilled in the art is naturally led to avoid their use for the industrial implementation of pressure sensors susceptible to be subjected to rapid or significant temperature changes.

In this context, however, the second aspect of the invention proposes a simple means of compensation, as a function of temperature, the output signal of a hydrostatic pressure sensor comprising a compound of at least three elements from columns III and V of the period table, permitting the making use of, even in an industrial environment, the advantages offered by these materials in their application to hydrostatic pressure transducers.

The second aspect of the invention resides in making use of the fact that the limitations which apply to temperature sensors in the case of piezoresistive silicon gauge sensors do not apply in the case of sensors directly sensitive to hydrostatic pressure, of the type previously mentioned, by reason of the homogeneous structure of these latter sensors.

A hydrostatic pressure sensor according to the second aspect of the present invention, which comprises at least one semi-conductor layer sensitive to pressure, constituted by a compound of at least three elements from columns III and V of the periodic table, and whose electrical resistance, varying with this pressure, has a value representative of this latter at constant temperature, this pressure sensitive layer being integral with a substrate constituted by a compound of at least two of said three elements and obtained by epitaxy, comprises in addition a temperature sensor, supported on the same substrate and capable of supplying a signal representative of the temperature in this latter.

In a preferred embodiment of the transducer of the second aspect of the invention, the pressure sensitive layer is constituted by aluminum gallium arsenide $Al_xGa_{1-x}As$ of which the relative proportion x of aluminum lies between 0.25 and 0.40, and the substrate is constituted by gallium arsenide.

Still more advantageously, the relative proportion x of aluminum of the pressure sensitive layer lies between 0.27 and 0.37, and has an optimum value lying between 0.29 and 0.35, and more precisely still between 0.32 and 0.33.

Preferably, this pressure sensitive layer is doped with impurities from column IV A and/or column VI A of the periodic table, more particularly the elements Si, Ge, Sn, S, Se and Te, at a total concentration lying between $2.10^{17}$ and $10^{20}$ atoms per cubic centimeter.

To optimize the temperature corrections, it is advantageous that the temperature sensor be itself essentially constituted by a temperature sensitive semi-conductor layer which exhibits a three dimensional distribution of electrons, which is constituted by a compound of the same elements as those of the pressure sensitive layer, and whose electrical resistance, varying with the temperature of the substrate, has a value representative of this latter at constant pressure, this temperature sensitive layer also being obtained by epitaxy.

In the case where the pressure sensitive layer is constituted by aluminum gallium arsenide, the temperature sensitive layer is preferably also constituted by aluminum gallium arsenide $Al_yGa_{1-y}As$, with a relative proportion y of aluminum lying between 0 and 0.25 or between 0.45 and 1.

In this case, said pressure and temperature sensitive layers can be built up one upon the other and separated by an insulating layer.

This insulating layer is preferably non-doped, formed by epitaxy, constituted by aluminum gallium arsenide $Al_zGa_{1-z}As$ of which the relative proportion z of aluminum lies between 0.40 and 0.50, and separated from the substrate by at least the pressure sensitive layer.

According to one implementation, the transducer of the second aspect of the invention comprises a first zone in which the sensing and insulating layers are built up one upon the other, and a second zone, laterally displaced with respect to the first, in which at least the upper sensing layer has been at least partly removed; it comprises in addition a first pair of metal contacts laid down in the first zone, separated one from the other by a first distance, and a second pair of metal contacts laid down in the second zone, separated one from the other by a second distance.

The first distance is advantageously less than twice the quantity represented by the square root of $rho_o \cdot e_o/((rho_1/e_1)+(rho_2/e_2))$, in which $rho_o$, $rho_1$ and $rho_2$ are the respective resistivities of the insulation layer, the sensing layer furthest from the substrate and the layer nearest the substrate, and in which $e_o$, $e_1$ and $e_2$ are the respective thicknesses of the insulation layer, the sensing layer furthest from the substrate and the layer nearest the substrate. Preferably, the second distance is then greater than this same quantity.

Other characteristics and advantages of the invention will appear more clearly from the following description, given by way of non-limitative example, with reference to the accompanying drawings, among which.

Figure 1:
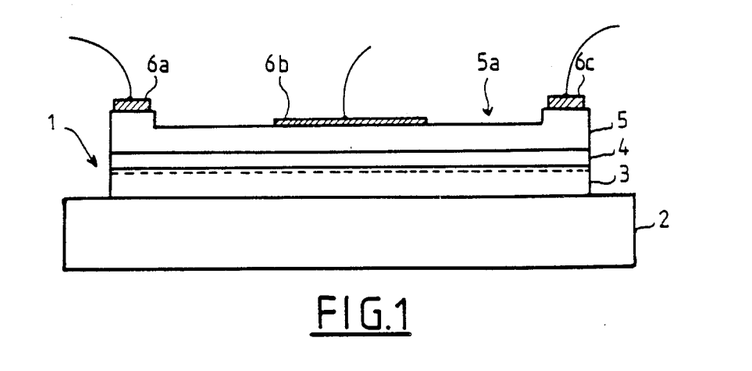
FIG. 1 is a sectional view of a TEGFET transistor usable within the framework of the present invention.

TEGFET transistors, such as that shown in FIG. 1, are known in the high speed electronic field. They take their designation from an abbreviation of their definition in the English language, "Two-Dimensional Electron Gas Field Effect Transistor", that is to say field effect transistor with two dimensional electron distribution.

They can be produced, for example, by the method described in the article "Growth of extremely uniform layers by rotating substrate holder with molecular beam epitaxy for applications to electro-optic and microwave devices", A. Y. Cho and K. Y. Cheng, Appl. Phys. Lett. 38(5), 1 Mar. 1981, pp. 360 to 362.

The structure of the TEGFET 1 of FIG. 1 is more precisely as follows.

The substrate 2 is formed from a semi-insulating wafer of gallium arsenide, of a thickness of the order of 300 micrometers for example.

On this substrate a layer 3 of non-doped gallium arsenide GaAs is deposited by epitaxy, of a thickness of 1 to several micrometers, constituting a buffer layer intended to provide a good surface for the later layers.

On this buffer layer 3 a supplementary layer (not shown) may be deposited by epitaxy, in non-doped aluminum gallium arsenide $Al_xGa_{1-x}As$, of which the relative proportion x of aluminum is less than 0.25 and of which the thickness is, for example, of the order of several tens of micrometers. Globally, the buffer layer 3, covered or not by this supplementary layer, thus constitutes a layer of non-doped aluminum gallium arsenide $Al_xGa_{1-x}As$, of which the relative proportion x of aluminum, in the limit zero, is less than 0.25.

On the buffer layer 3 or on this optional supplementary layer (not shown), a separation layer 4 of non-doped aluminum gallium arsenide $Al_yGA_{1-y}As$ is deposited, also by epitaxy, of which the relative proportion y of aluminum is greater than x and lies between 0.15 and 1. The thickness of this separation layer 4 is for example of the order of 0 to 30 nanometers.

On this separation layer 4 there is then deposited, still by epitaxy, a layer 5 of doped aluminum gallium arsenide $Al_yGa_{1-y}As$, of which the relative proportion y of aluminum is substantially the same as that of the separation layer 4, and of which the thickness lies for example between 30 and 100 nanometers.

The layer 5 can be doped with impurities from column IV A and/or column VI A of the periodic table, in particular with at least one of the elements Si, Ge, Sn, S, Se and Te, at a total concentration, integrated over the thickness of the layer, lying between $10^{12}$ and $10^{13}$ atoms per square centimeter.

As FIG. 1 shows symbolically, by dotted lines, a two dimensional gas of electrons appears at the interface which the layers 4 and 5 of aluminum gallium arsenide $Al_yGa_{1-y}As$ form with the layer 3, and its possible supplementary layer, of aluminum gallium arsenide $Al_xGa_{1-x}As$.

The layer 5 is covered in a known manner with a contact layer of gallium arsenide GaAs, then etched to provide a central depression 5a, after which metallic contacts 6a, 6b, 6c intended to constitute respectively the drain, the gate and the source of the transistor, are deposited.

Figure 2:
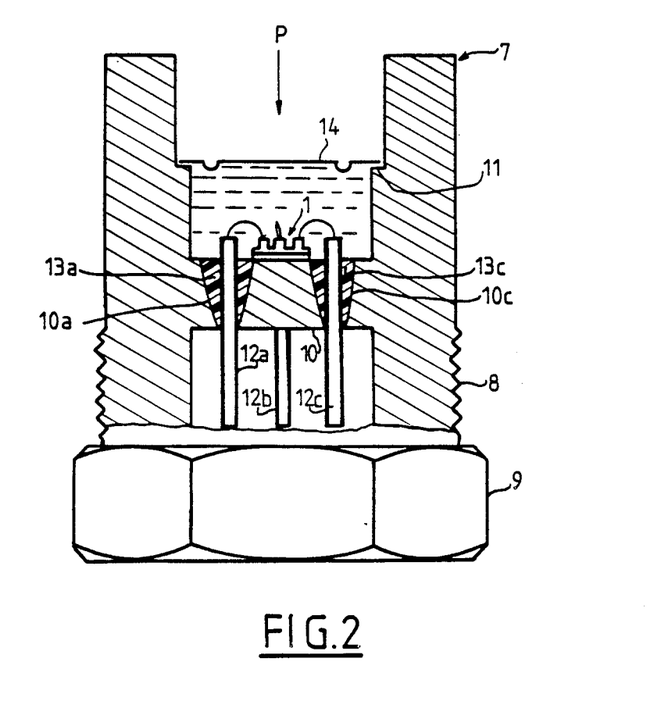
FIG. 2 is a sectional view of an assembly using the principles of the present invention.

FIG. 2 shows a possible way of mounting the TEGFET transistor 1 as a hydrostatic pressure sensor.

The support of the transistor 1 is constituted by a piece of steel 7 which, with the exception of a screw-thread 8 and head 9 with flats permitting it to be turned, a flat transverse support surface 10 and an internal peripheral ledge 11, is of substantially cylindrical form.

The transistor 1 is on the side adjacent the ledge, bonded by means of a flexible adhesive to the support surface 10, in which are formed three bores 10a, 10b, 10c, of which two are visible in FIG. 2.

A respective electrical terminal, such as 12a, 12b, 12c, is secured in each of the bores by means of a glass bead such as 13a, 13b, 13c, which ensures on the one hand the rigid connection of each terminal to the support surface 10, and on the other hand the electrical insulation of this terminal and this surface, and finally the sealed closure of the bores 10a to 10c.

On the side adjacent the ledge 11, each electrical terminal is connected to contact such as 6a, 6b or 6c of the transistor 1, the assembly being immersed in an enclosed volume of insulating oil by a deformable steel membrane 14 welded on to the ledge 11.

The piece 7 thus formed can be screwed into the wall of any enclosure in which there exists a pressure P to be measured. This latter, transmitted through the deformable membrane 14 to the volume of oil in which the transistor is immersed, subjects the latter to conditions of hydrostatic pressure and temperature which permit, according to the teachings of the invention, measurement in a optimum manner as described hereinafter with reference to FIGS. 3 and 4.

Figure 3:
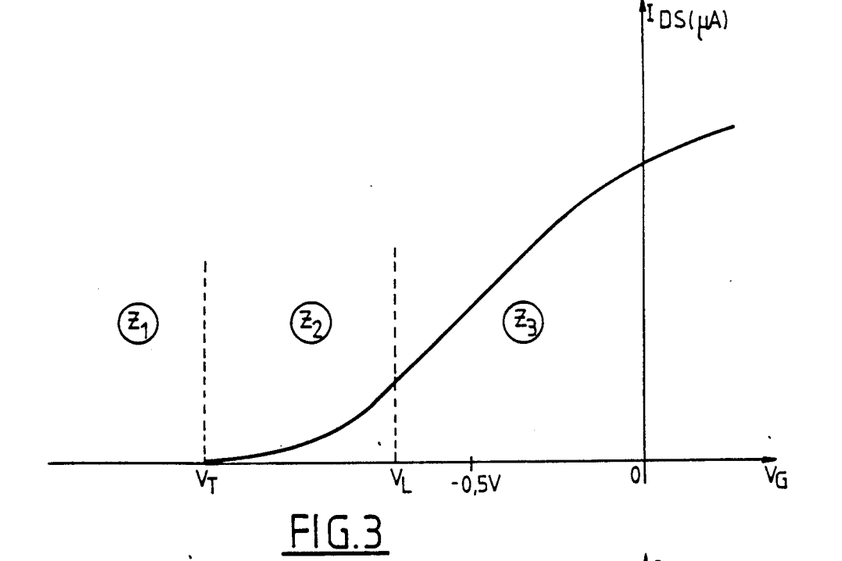
FIG. 3 is a diagram showing the variation of the drain-source current of a TEGFET transistor as a function of the gate voltage applied to it.

FIG. 3 shows the variation of the current $I_{DS}$ flowing between the drain and the source of a TEGFET as a function of the voltage $V_G$ applied to its gate, with the voltage $V_{DS}$ applied between the drain and the source of the transistor being maintained constant.

This figure shows a first zone Z1, known as the cut-off zone, corresponding to values of the gate voltage $V_G$ for which no current flows in the transistor.

A second zone Z2, known as the saturation regime zone, appears for values of the gate voltage greater than a limit value $V_T$, known as the threshold value, but less than the value of the gate voltage $V_L$ beyond which a third zone, known as the linear regime zone, begins, characterized by a linear relationship of the variation of the current $I_{DS}$ as a function of the voltage $V_G$.

Figure 4:
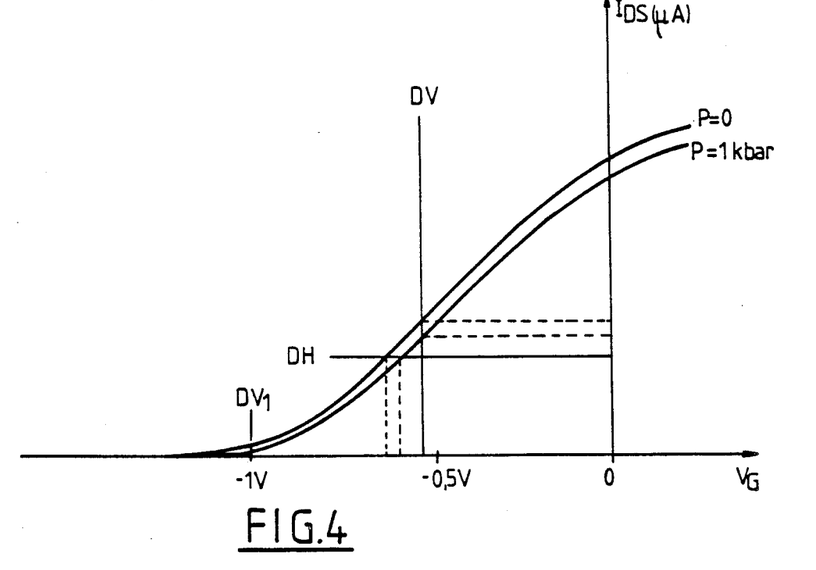
FIG. 4 is a diagram showing the variations of the drain-source current of the channel of a TEGFET transistor as a function on the one hand of the gate voltage applied to it and on the other hand of the hydrostatic pressure to which it is subjected.

FIG. 4 likewise shows the variation of the drain-source current $I_{DS}$ as a function of the voltage $V_G$ applied to the gate for a constant value of the voltage $V_{DS}$, but for two different values of a hydrostatic pressure P applied to the transistor.

This figure immediately demonstrates the fact that the current $I_{DS}$ falls as the applied pressure P rises, a phenomenon of which the optimum exploitation is the basis of the invention.

The value of the current $I_{DS}$, measured while maintaining constant the biasing of the transistor 1 subjected to pressure, that is to say maintaining constant the gate, drain and source voltages of this transistor, is in effect usable as a signal representative of the pressure P.

This measurement technique is illustrated by the vertical line DV of FIG. 4, which, at two different values of the pressure, corresponds uniquely to two different values of the current $I_{DS}$.

Figure 6:
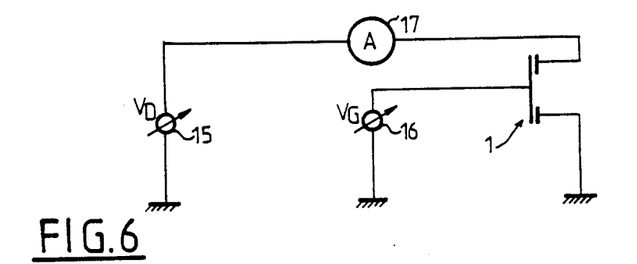
FIG. 6 is a circuit diagram of a device using a first technique for measuring the pressure.

A device for implementing this technique is shown in FIG. 6. In addition to the transistor 1, this device comprises an adjustable voltage source 15 for supplying a constant but adjustable drain voltage $V_D$, an adjustable voltage source 16 for supplying a constant but adjustable gate voltage $V_G$, and an ammeter 17 for indicating the value of the current $I_{DS}$. The source is also connected to a constant potential, for example earth.

However, as FIG. 4 shows, another measurement technique is equally possible, since in effect the value to which it is necessary to adjust the gate voltage $V_G$ so as to maintain the current $I_{DS}$ constant, while maintaining the drain and source voltages constant, is also representative of the hydrostatic pressure to which the transistor is subjected.

This second measurement technique is illustrated by the horizontal straight line DH of FIG. 4, which, at two different values of the pressure, makes correspondence uniquely with two different values of the gate voltage $V_a$ for the same value of the current $I_{DS}$.

Figure 7:
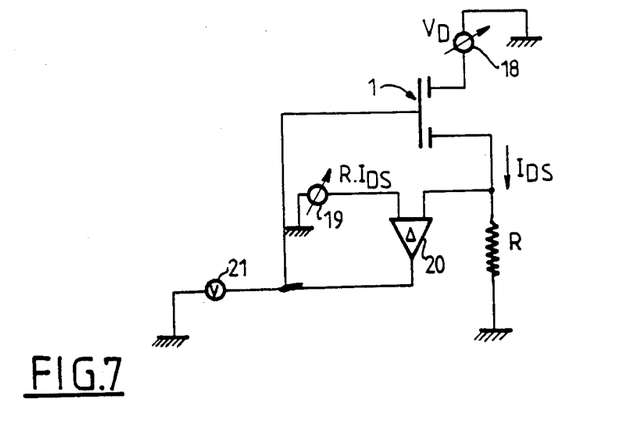
FIG. 7 is a circuit diagram of a device using a second technique for measuring the pressure.

A device for implementing this second technique is shown in FIG. 7. Besides the transistor 1, this device comprises an adjustable voltage source 18 adapted to supply a constant but adjustable drain voltage $V_D$, a resistance of value R connected between the source of the transistor and earth, and through which the current $I_{DS}$ flows, an adjustable voltage source 19 adapted to supply a reference voltage equal to the product $R.I_{DS}$, a differential amplifier 20 whose inputs are connected to the source of the transistor 1 and to the voltage source 19 and whose output is connected to the gate of the transistor, and a voltmeter 21 for indicating the value of the voltage $V_G$.

In such an arrangement, the amplifier 20 adjusts the gate voltage such that the voltage at the terminals of the resistor R remains constant, which determines on the one hand the value of the source voltage of the transistor 1, and on the other hand the value of the current $I_{DS}$.

A first, and considerable, advantage of using a TEGFET, compared with using a passive component such as the heterostructure without a gate described in the article "Hydrostatic Pressure Control of the Carrier Density in GaAs/GaAlAs Heterostructures; the role of the metastable deep levels" previously mentioned, and which is directly obtained by implementation of either of the two measurement techniques described with reference to FIG. 4, resides in the fact that the control of the gate voltage, which it is important not to leave floating, ensures a good immunity to parasitics by screening the pressure sensitive conductive channel from all electrostatic influence from the external surroundings.

A second advantage resulting from the use of a TEGFET, compared to the use of a different transistor, a MOSFET for example, resides in the fact that a TEGFET is directly sensitive to hydrostatic pressure, so that structures which are simultaneously complex, fragile and limited in their performance, particularly by problems of long term stability and hysteresis, but which must nevertheless be used to convert a hydrostatic pressure to be measured to a strain to which the sensor is actually sensitive, become unnecessary.

However, the use of a TEGFET, compared to the use of a passive sensor, leads to another advantage, if it is used in conformity with the present invention according to the following procedure.

As FIG. 4 shows, the relative variation of the current $I_{DS}$ is maximum at the most negative values of the gate voltage, that is to say in the zone Z2 of the saturation regime. For example, the relative variation of the current $I_{DS}$ for an absolute variation of 1 kbar in pressure is of the order of 14% while the transistor is operating in the linear regime (zone Z3), for a value of $V_G$ in the neighborhood of −0.5 volts, while it can exceed 50% when the transistor is operating in the saturation regime, that is to say with a gate voltage just above the threshold value $V_T$.

Thus, since the adjustment of the gate voltage permits a displacement of the measurement point along each of the curves of FIG. 4, it is possible to dynamically adapt the TEGFET sensor to the pressure domain in which it is working, and, to the extent that each curve can possibly vary as a function of other physical parameters, for example temperature, it is even possible to adapt the TEGFET sensor to its complete measurement environment.

In particular, in the case where the hydrostatic pressure measurement conditions evolve, in particular by variation of this pressure itself or by variation of the temperature, in the neighborhood of mean measurement conditions, it is advantageous to adjust, for these mean measurement conditions, the gate voltage to a value just above the threshold voltage of the transistor, and the drain-source voltage to a value greater than the difference between the gate voltage and the threshold voltage, such that the transistor operates in the saturation regime.

Figure 5:
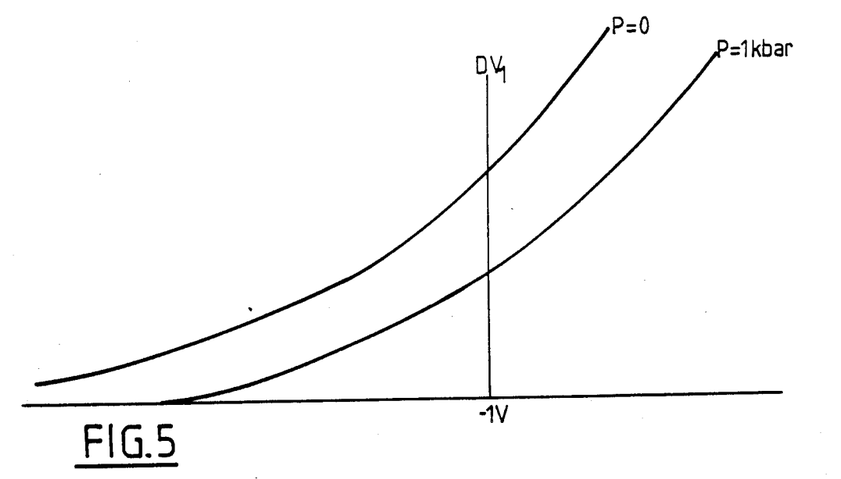
FIG. 5 is an enlargement of part of FIG. 4.

This measurement technique is illustrated by the vertical line DV1 in FIG. 4, in the neighborhood of which the resolution of the sensor, for variations of pressure around a mean hydrostatic pressure of 1 kbar, is excellent, as is better shown in the enlarged view of FIG. 5.

According to another measurement technique, it is possible to use a TEGFET to obtain a measure of hydrostatic pressure in the form of a frequency signal.

To this end, the sensor comprises an odd number of inverters implemented by means of TEGFET transistors and Schottky diodes connected so as to constitute a ring oscillator, supplying a signal whose frequency is representative of the pressure conditions to which these transistors are subjected.

Although the possibility of obtaining, by means of active pressure sensors connected in a ring to form an oscillator circuit, a frequency signal representative of a pressure to be measured has already been described, for example in European Patent No. EP 0040795, the use of a TEGFET, in accordance with the teachings of the present invention, permits a direct measurement of hydrostatic pressure, with the necessity of recourse to the use of membranes.

Figure 8:
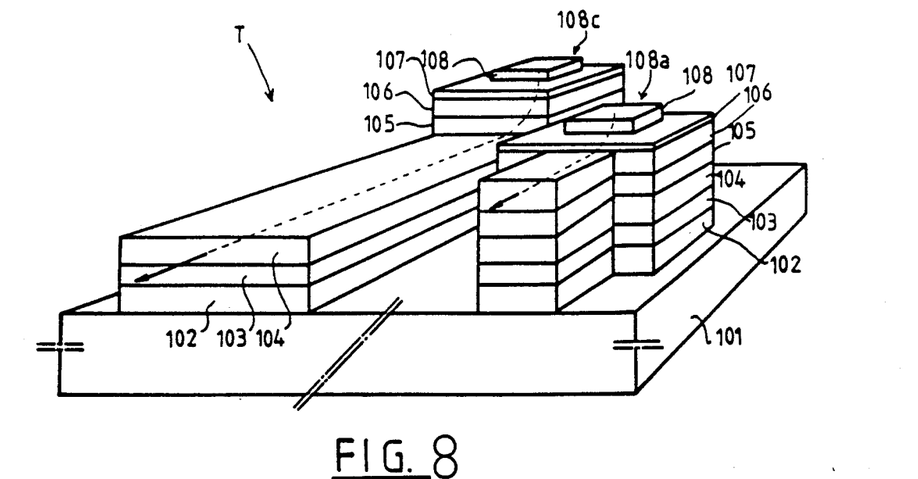
FIG. 8 is a sectional view of a transducer according to the invention, made following the line I—I of FIG. 9.

The transducer T of FIG. 8 comprises a substrate 101 made from a binary compound of elements from columns III and V of Mendeleyev's table, and preferably gallium arsenide GaAs, rendered semi-insulating, for example by the introduction of chromium. The thickness of this substrate is for example of the order of 300 micrometers, and its resistivity is as high as possible.

On the substrate 101 is deposited by epitaxy a buffer layer 102, of the same composition as the substrate, and of a thickness of at least about 1 micrometer, the role of this layer being to offer to the following layers a support surface of good smoothness and good crystallographic quality.

On the buffer layer 102 is then deposited by epitaxy a non-doped separation layer 103 constituted by a compound of at least three elements from columns III and V of Mendeleyev's table, among which are included the two elements forming the substrate, the elements from columns III and V being present in the same proportions.

For example, this separation layer can be constituted by a compound $In_uGa_{1-u}As_vP_{1-v}$.

In the case where the substrate is of gallium arsenide, this layer is preferably constituted by aluminum gallium arsenide $Al_uGa_{1-u}As$ and its relative proportion u of aluminum is, at its upper surface, at least equal to 0.25.

The role of this separation layer, of which the thickness is of the order of several hundred micrometers, is to avoid the appearance of a two-dimensional layer of electrons at the interface with the following layer.

On the separation layer 103 is deposited by epitaxy an active layer 104 composed of the same elements as the separation layer, although in possibly different proportions, that is aluminum gallium arsenide $Al_xGa_{1-x}As$ for a gallium arsenide substrate.

The active layer, which is sensitive to pressure, has a thickness of several tens of micrometers to several micrometers, and is doped with impurities from column IV A and/or column VI A, more precisely by at least one of the elements Si, Ge, Sn, S, Se, and Te, at a total concentration lying between $2.10^{17}$ and $10^{20}$ atoms per cubic centimeter, so as to become the seat of a three dimensional distribution of electrons. By way of non-limitative example, the active layer can be doped with silicon at a concentration of $10^{19}$ atoms per cubic centimeter.

The relative proportion x of aluminum of the sensing layer 104 lies between 0.25 and 0.40, more advantageously still between 0.27 and 0.37 and more precisely between 0.29 and 0.35, the values between 0.32 and 0.33 being optimum.

The relative proportion u of aluminum at the upper surface of the separation layer 103, for which it has already been indicated that it was at least equal to 0.25, ought additionally to be at least equal to the relative proportion x of aluminum in the sensing layer 104. Except for this restriction, the separation layer 103 can have a proportion of aluminum which is constant throughout the thickness of this layer, or exhibits a gradient of increasing proportion of aluminum from its surface nearest the substrate to its upper surface.

Figure 9:
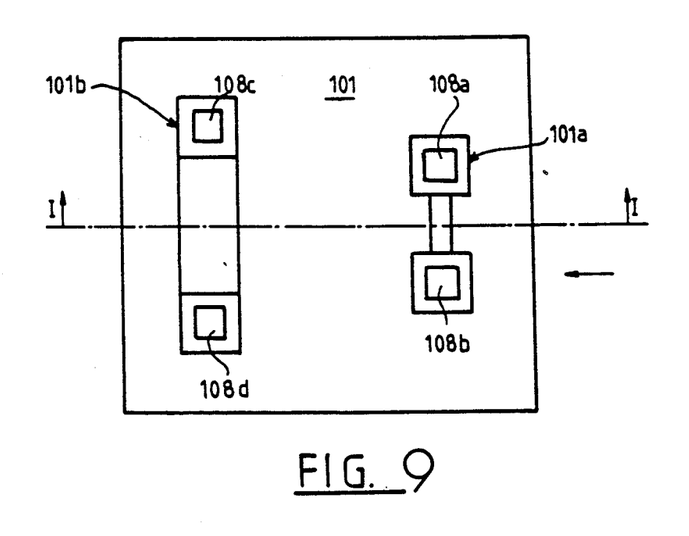
FIG. 9 is a plan view of a transducer according to the invention.

At this stage of the production process, each of the layers 102 to 104 extends a priori over the whole surface of the substrate 101: it is only by a subsequent etching process that these layers can be formed into small blocks such as those which appear on the left and on the right of FIGS. 8 and 9; however, after deposition of the layers 102 to 104 on the substrate 101, several solutions are possible.

The first consists of etching the layers to obtain a block such as that which is formed in the left zone of the transducer of FIGS. 8 and 9, then to deposit on a second zone of the transducer, preferably a zone in which the substrate has been uncovered, a temperature sensor adapted to supply a signal representative of the temperature of the substrate, for example constituted by a thin metal layer.

Another possibility, corresponding to the embodiment of the invention which is shown in FIGS. 8 and 9 and to the preferred use of a gallium arsenide substrate, consists, before any etching of the layers 102 to 104, of depositing other layers on these latter, in the manner described hereinafter.

A non-doped insulation layer 105 constituted by aluminum gallium arsenide $Al_zGa_{1-z}As$ of which the relative proportion z of aluminum lies for example between 0.40 and 0.50, is deposited by epitaxy on the pressure sensitive layer 104.

On this last insulation layer 105 is then deposited, also by epitaxy, a temperature sensitive layer 106, constituted by aluminum gallium arsenide $Al_yGa_{1-y}As$ of which the relative proportion y of aluminum lies between 0 and 0.25 or between 0.45 and 1.

In this structure, the pressure and temperature sensitive layers 104 and 106 are thus built up one upon the other and separated by the insulation layer 105, this last being separated from the substrate by the pressure sensitive layer 104, and by the buffer and separation layers 102 and 103.

To be more precise, the proportion of aluminum in the insulation layer is chosen such that the electronic barriers between this layer and each of the sensing layers is maximum.

Typically, the layers 104, 105 and 106 have a thickness of the order of 2 micrometers.

In contrast to the insulation layer, which is not doped, the temperature sensitive layer 106 is, like the pressure sensitive layer, doped as n-type with impurities from column IV A and/or column VI A, more specifically with at least one of the elements Si, Ge, Sn, S, Se and Te, silicon and tin constituting the most typical examples.

On the temperature sensitive layer 106 is deposited by epitaxy a layer 107 of gallium arsenide GaAs, called "the contact receiving layer", of a thickness of 5 to 50 nanometers, permitting the establishment of a good electrical contact between a metallization layer 108 which covers it and one or other of the pressure and temperature sensitive layers 104 and 106.

The metallization layer 108, for example constituted by gold, germanium and nickel alloyed at about 450° C. to 500°C., forms separate contact pads 108a, 108b, 108c and 108d.

After the deposition operation, an etching process takes place, to lead, for example, to the structure of FIGS. 8 and 9.

The layers 107 to 102 deposited on the substrate 101 are cut so as to form two blocks, respectively appearing in the first zone 101a, at the right of FIGS. 8 and 9, and in the second zone 101b, at the left.

Then, in the second zone the upper layers 107 to 105 are removed, with the exception of the metallization pads, such that outside these latter, the pressure sensitive layer 104 constitutes the external layer.

The geometry of the arrangement is such that the distance between the pads of the first zone is very advantageously less than twice the quantity represented by the square root of: $rho_o \cdot e_o/((rho_1/e_1)+(rho_2/e_2))$, where $rho_o$, $rho_1$ and $rho_2$ are the respective resistivities of the insulation layer 105, the temperature sensitive layer 106 (which is furthest from the substrate) and the pressure sensitive layer (which is nearest to the substrate), and where $e_o$, $e_1$ and $e_2$ are the respective thicknesses of the insulation layer, the sensing layer furthest from the substrate and the layer nearest the substrate.

The distance between the pads of the second zone is, for its part, preferably greater than this same quantity.

In such a structure, the predominant electrical currents which are capable of being applied by external current sources between the pads 108a, 108b on the one hand, and 108c, 108d on the other hand, follow the paths indicated schematically by arrows in FIG. 8.

If these sources deliver constant and known currents, the voltage between the pads 108a and 108b is essentially representative of the temperature of the transducer T constituted by the described structure, and therefore in particular of the substrate 101, while the voltage between the pads 108c and 108d is essentially representative of the pressure to which this transducer is subjected.

The signal representative of the temperature can be used, in a manner known per se, but with an effectiveness due to the present invention, to correct the signal representative of the pressure, without the appearance of problems due to environmental differences between the sensing layers present in the transducer.

Preferably, as shown in FIG. 9, the conduction channel of the first zone is narrower than the conduction channel of the second zone, such that the two channels exhibit electrical resistances of the same order of magnitude.

After etching, achieved as indicated earlier, it is very preferable, as is well known in a more general context in the semi-conductor field, to proceed to a passivation of the transducer. This latter is effected by the deposition of a passivation layer which covers the whole structure, then by a selective opening of this passivation layer, permitting the uncovering only of the pads 108a to 108d, these last subsequently receiving a new metallization layer which extends above the level of the passivation layer.

Figure 10:
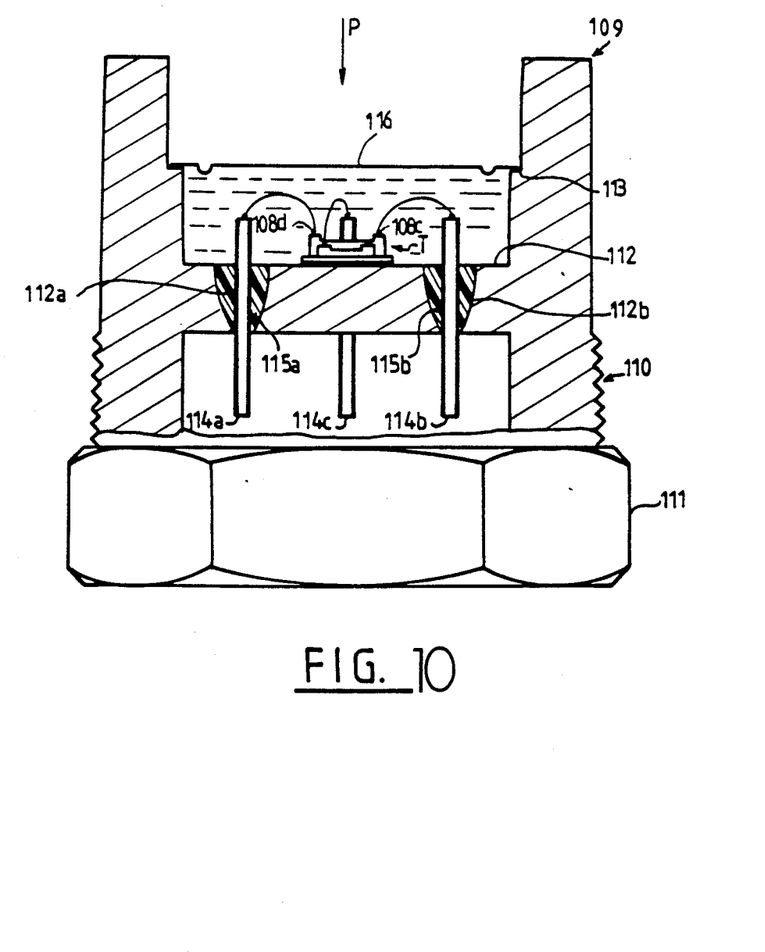
FIG. 10 is a sectional view of an assembly using the transducer of the present invention.

FIG. 10 shows a possible way of mounting a transducer in accordance with the present invention.

The support for the transducer is constituted by a piece of steel 109 which, with the exception of a screw-thread 110 and head 111 with flats permitting it to be turned, a flat transverse support surface 112 and an internal peripheral ledge 113, is of substantially cylindrical form.

The transducer T is on the side adjacent the ledge, bonded by means of a flexible adhesive to the support surface 112, in which are formed four bores 112a, 112b, 112c, 112d, of which two are visible in FIG. 10.

A respective electrical terminal, such as 114a, 114b, 114c, is secured in each of the bores by means of a glass bead such as 115a, 115b, which ensures on the one hand the rigid connection of each terminal to the support surface 112, and on the other hand the electrical insulation of this terminal and this surface, and finally the sealed closure of the bores 112a to 112d.

On the side adjacent the ledge 113, each electrical terminal is connected to a pad such as 108c, 108d of the transducer T, the assembly being immersed in an enclosed volume of insulating oil by a deformable steel membrane 116 welded on to the ledge 113.

The piece 109 thus formed can be screwed into the wall of any enclosure in which there exists a pressure P to be measured. This latter, transmitted through the deformable membrane 116 to the volume of oil in which the transducer is immersed, subjects the latter to conditions of hydrostatic pressure and temperature which are measured by virtue of the resistance changes detected at the terminals 114a to 114d outside the enclosure.

We claim:

1. A device sensitive to hydrostatic pressure, comprising at least a first layer of aluminum gallium arsenide $Al_xGa_{1-x}As$ of which the relative proportion x of aluminum is less than 0.25, and a second layer of aluminum gallium arsenide $Al_yGa_{1-y}As$ of which the relative proportion y of aluminum is greater than x and lies between 0.15 and 1, and in which is formed, at the interface of these two layers, a conduction channel whose resistance varies as a function of a pressure to which the device is subjected, this latter comprising a two-dimensional electron gas field effect transistor (TEGFET) comprising a drain, a source and a gate.

2. A device according to claim 1, characterized in that the layer of aluminum gallium arsenide $Al_yGa_{1-y}As$ is selectively doped with impurities from column IV and/or column VI of the periodic table, at a total concentration, integrated over the thickness of the layer, which lies between $10^{12}$ and $10^{13}$ atoms per square centimeter.

3. A device according to claim 1, characterized in that it comprises means for maintaining the gate, drain and source at constant voltages, and means for measuring the current flowing between the drain and the source.

4. A device according to claim 1, characterized in that it comprises means for maintaining the drain and source at constant voltages, and means for adjusting the gate voltage so as to maintain the current flowing between the drain and the source constant.

5. A hydrostatic pressure transducer comprising:
   (a) at least one semiconductor layer including at least three elements from columns III and V of the periodic table, the electrical resistance of said layer being pressure sensitive and having a value representative of pressure at a constant temperature, said pressure sensitive layer being integral with a substrate including at least two of said three elements; and
   (b) a temperature sensor formed on the same substrate as said pressure sensitive layer and proximate thereto, whereby said temperature sensor is capable of supplying a signal representative of the temperature of said pressure sensitive layer.

6. A transducer according to claim 5, characterized in that said pressure sensitive layer is constituted by aluminum gallium arsenide $Al_xGa_{1-x}As$ of which the relative proportion x of aluminum lies between 0.25 and 0.40, and the substrate is constituted by gallium arsenide.

7. A transducer according to claim 6, characterized in that the relative proportion x of aluminum of said aluminum gallium arsenide layer lies between 0.27 and 0.37.

8. A transducer according to claim 7, characterized in that the relative proportion x of aluminum of said aluminum gallium arsenide layer lies between 0.29 and 0.35.

9. A transducer according to claim 6, characterized in that said pressure sensitive layer is doped with impurities selected from either of column IV A and column VI A of the periodic table, at a total concentration lying between $2.10^{17}$ and $10^{20}$ atoms per cubic centimeter.

10. A transducer according to claim 5, wherein said temperature sensor comprises another semi-conductor layer, which is constituted by a compound of the same elements as those of the pressure sensitive layer, the electrical resistance of said other layer being temperature sensitive and having a value representative of temperature at constant pressure.

11. A transducer according to claim 10, characterized in that said pressure sensitive layer is constituted by aluminum gallium arsenide $Al_xGa_{1-x}As$ of which the relative proportion x of aluminum lies between 0.25 and 0.40, the substrate is constituted by gallium arsenide, and said temperature sensitive layer is constituted by aluminum gallium arsenide $Al_yGa_{1-y}As$, with a relative proportion y of aluminum selected from the ranges 0 to 0.25 and 0.45 to 1.

12. A transducer according to claim 11, characterized in that said pressure and temperature sensitive layers are built up one upon the other and separated by an insulating layer.

13. A transducer according to claim 12, wherein said insulating layer is comprised of non-doped aluminum gallium arsenide $Al_zGa_{1-z}As$ of which the relative proportion, z, of aluminum lies between 0.40 and 0.50, and said insulating layer is separated from the substrate by at least the pressure sensitive layer.

14. A transducer according to claim 11, wherein said temperature sensor comprises a first element made up of material identical with that of said pressure sensitive layer, and a second element comprising said temperature sensitive layer, said pressure and temperature sensitive layers of said first and second elements being formed upon one another and separated by an insulation layer.

15. A transducer according to claim 14, wherein said first element is formed between the substrate and said second element.

16. A transducer according to claim 14, wherein said pressure sensitive layer and temperature sensitive layers are formed by epitaxy.

17. A transducer according to claim 14, wherein said insulating layer is constituted by non-doped aluminum-gallium arsenide $Al_zGa_{1-z}As$ of which the relative proportion z of aluminum lies between 0.40 and 0.50.

18. A transducer according to claim 10, further comprising a first zone in which the sensing and insulating layers are built up one upon the other, a second zone in which at least the upper sensing layer has been at least partly removed, a first pair of metal contacts laid down in the first zone, separated one from the other by a first distance, and a second pair of metal contacts laid down in the second zone, separated one from the other by a second distance.

19. A transducer according to claim 18, characterized in that said first distance is less than twice the quantity represented by the square root of $rho_o \cdot e_o/((rho_1/e_1)+(-rho_2/e_2))$, in which $rho_o$, $rho_1$ and $rho_2$ are the respective resistivities of the insulation layer, the sensing layer furthest from the substrate and the layer nearest the substrate, and in which $e_o$, $e_1$ and $e_2$ are the respective thicknesses of the insulation layer, the sensing layer furthest from the substrate and the layer nearest the substrate.

20. A transducer according to claim 18, characterized in that said second distance is greater than the quantity represented by the square root of $rho_o \cdot e_o/((rho_1/e_1)+(-rho_2/e_2))$, in which $rho_o$, $rho_1$ and $rho_2$ are the respective resistivities of the insulation layer, the sensing layer furthest from the substrate and the layer nearest the substrate, and in which $e_o$, $e_1$ and $e_2$ are the respective thicknesses of the insulation layer, the sensing layer furthest from the substrate and the layer nearest the substrate.

21. A transducer according to claim 10, wherein said temperature sensitive semiconductor layer exhibits a three dimensional distribution of electrons.

22. A method of measuring a hydrostatic pressure comprising the steps of:
   (a) subjecting a two-dimensional electron gas field effect transistor (TEGFET) comprising a drain, a source, and a gate to a hydrostatic pressure to be measured; and
   (b) measuring an electrical characteristic of said transistor in response to the effect of such hydrostatic pressure on the physical characteristics of the two dimensional electron gas in said transistor.

23. A method according to claim 22, characterized in that the first operation consists essentially of subjecting to the hydrostatic pressure to be measured a group of two dimensional electron gas field effect transistors integrated as a ring oscillator, and in that the third operation consists essentially of collecting a signal of which the frequency is representative of the pressure to be measured.

24. The method of claim 22 wherein said measuring step comprises:
   (a) adjusting the gate voltage for a particular mean measurement condition to a value just above the threshold voltage of said transistor; and
   (b) adjusting the drain-source voltage to a value greater than the difference between the gate voltage and the threshold voltage,
   whereby the transistor is operated in its saturation regime, e.g., under pressure variations about said mean measurement condition.

25. A hydrostatic pressure transducer comprising:
   (a) first resistor means comprising at least one first semiconductor layer consisting of a compound of at least three elements from columns III and V of the periodic table, the electrical resistivity of said layer being sensitive to hydrostatic pressure applied to said layer, said first layer being integral with a substrate consisting of a compound of at least two of said three elements; and
   (b) second resistor means comprising at least one second semiconductor layer consisting of a compound of at least three elements from columns III and V of the periodic table, the electrical resistivity of said second layer being sensitive to temperature, said second semiconductor layer being formed integrally on the same substrate at a location such that the temperature of said second layer is essentially the same as the temperature of said first layer at all times.

26. A hydrostatic pressure transducer comprising:
   (a) first resistor means comprising an element of a first semiconductor layer consisting of a compound of at least three elements from columns III and V of the periodic table, said first layer being integral with a substrate consisting of a compound of at least two of said three elements; and
   (b) second resistor means comprising an element of said first semiconductor layer and an element of a second semiconductor layer consisting of a compound of at least three elements from columns III and V of the periodic table, said second semiconductor layer being formed integrally above said first layer, the electrical resistivity of one of said layers being sensitive to hydrostatic pressure applied to said one layer and the electrical resistivity of the other of said layer being sensitive to temperature in the immediate environment of said layers.

27. The hydrostatic pressure transducer of claim 26, wherein said first and second layers of said second resistor means are separated by an insulating layer.

28. The hydrostatic pressure transducer of claim 27, wherein the resistivity of said first semiconductor layer is sensitive to hydrostatic pressure, and said first layer is arranged such that the electrical resistance of said first resistor means is essentially representative of the hydrostatic pressure applied to said transducer at constant temperature and the resistivity of said second semiconductor layer is sensitive to temperature, and said second layer is arranged such that the electrical resistance of said second resistor means is essentially representative of the temperature of said first layer at constant pressure.

29. The hydrostatic pressure transducer of claim 26, wherein said first resistor means comprises a first pair of metal contacts spaced apart by a first distance above the respective element of said first semiconductor layer and said second resistor means comprises a second pair of metal contacts spaced apart by a second distance different from said first distance above the respective element of said second semiconductor layer.

* * * * *